United States Patent
Schmid et al.

(10) Patent No.: US 7,501,660 B2
(45) Date of Patent: Mar. 10, 2009

(54) HOUSING FOR AN ELECTRONIC COMPONENT

(75) Inventors: Josef Schmid, Regensburg (DE); Stefan Grötsch, Bad Abbach (DE); Michael Hiegler, Regensburg (DE); Moritz Engl, Regensburg (DE); Georg Bogner, Lappersdorf (DE); Karlheinz Arndt, Bad Abbach (DE); Markus Schneider, Schönhofen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 231 days.

(21) Appl. No.: 11/169,861

(22) Filed: Jun. 29, 2005

(65) Prior Publication Data

US 2006/0014429 A1    Jan. 19, 2006

(30) Foreign Application Priority Data

Jun. 29, 2004  (DE) .............. 10 2004 031 391

(51) Int. Cl.
    *H01L 27/15* (2006.01)
    *H01L 31/12* (2006.01)
    *H01L 33/00* (2006.01)

(52) U.S. Cl. .......... 257/81; 257/E33.061; 257/99; 257/100; 257/678; 313/501; 313/502

(58) Field of Classification Search .......... 257/E33.059, 257/E33.061, 81, 99, 100, 678, 789, 790, 257/795; 313/501–503, 512, 498
See application file for complete search history.

(56) References Cited

U.S. PATENT DOCUMENTS

| | | | |
|---|---|---|---|
| 4,191,943 A * | 3/1980 | Cairns et al. | 340/815.42 |
| 5,411,792 A * | 5/1995 | Yukinobu et al. | 428/212 |
| 5,914,501 A | 6/1999 | Antle et al. | |
| 5,970,321 A | 10/1999 | Hively | |
| 5,989,942 A * | 11/1999 | Ishikawa et al. | 438/127 |
| 6,066,861 A | 5/2000 | Höhn et al. | |
| 6,069,440 A * | 5/2000 | Shimizu et al. | 313/486 |
| 6,185,240 B1 | 2/2001 | Jiang et al. | |
| 6,482,664 B1 * | 11/2002 | Lee et al. | 438/28 |
| 6,737,681 B2 * | 5/2004 | Koda | 257/98 |

(Continued)

FOREIGN PATENT DOCUMENTS

DE    89 14 902.5    4/1991

(Continued)

OTHER PUBLICATIONS

German Examination Report for the corresponding German Application issued on Mar. 13, 2008.

(Continued)

*Primary Examiner*—Chris C. Chu
(74) *Attorney, Agent, or Firm*—Cohen Pontani Lieberman & Pavane LLP

(57) ABSTRACT

A housing is specified for an electronic component having at least two connecting parts (4a, 4b), which are partially in contact with the housing. The conductivity of at least subareas of the housing are set in a defined manner and current paths through the housing are formed between the connecting parts. The housing thus has a defined resistance (2), which is connected in parallel with an electronic component (1), and provides ESD protection for the component (1).

21 Claims, 3 Drawing Sheets

U.S. PATENT DOCUMENTS

| | | | | |
|---|---|---|---|---|
| 7,025,651 | B2 * | 4/2006 | Song et al. | 445/50 |
| 7,045,956 | B2 * | 5/2006 | Braune et al. | 313/512 |
| 7,253,449 | B2 * | 8/2007 | Wu | 257/99 |
| 2002/0153835 | A1 * | 10/2002 | Fujiwara et al. | 313/512 |
| 2003/0080341 | A1 * | 5/2003 | Sakano et al. | 257/79 |
| 2003/0232455 | A1 * | 12/2003 | Tanaka | 438/27 |
| 2007/0007540 | A1 * | 1/2007 | Hashimoto et al. | 257/94 |
| 2007/0024173 | A1 | 2/2007 | Braune | |

FOREIGN PATENT DOCUMENTS

| | | |
|---|---|---|
| JP | 2006-100364 | 4/2006 |
| JP | 2006100364 A * | 4/2006 |
| WO | WO 03/049187 A2 | 6/2003 |

OTHER PUBLICATIONS

J. Lambert Bates Bates et al. "Electrical Conductivity of $MgAl_2O_4$ and $Y_3Al_5O_{12}$", *Communications of the American Ceramic Society*, p. 138 to 141, Oct. 1981.

* cited by examiner

HOUSING FOR AN ELECTRONIC COMPONENT

RELATED APPLICATIONS

This patent application claims the priority of German patent application No. 10 2004 031 391.1 filed Jun. 29, 2004 the disclosure content of which is hereby incorporated by reference.

FIELD OF THE INVENTION

The invention relates to a housing for an electronic component, to an electric device and to a method for production of a housing for an electronic component.

BACKGROUND OF THE INVENTION

The document U.S. Pat. No. 6,185,240 B1 describes a laser diode with a second diode connected anti-parallel with it. The second diode in this case represents protection against electrostatic discharge (ESD) for the laser diode. This protects the laser diode against ESD voltage pulses, which can occur in the reverse-biased direction of the laser diode.

The document U.S. Pat. No. 5,914,501 describes a light-emitting diode arrangement with a secondary connecting element, which forms ESD protection for the light-emitting diode. The secondary connecting element is connected in parallel with the light-emitting diode and protects the light-emitting diode by dissipating electric current from the light-emitting diode and by thus limiting the voltage which is applied to the light-emitting diode in the reverse-biased direction to a specific maximum value. The secondary connecting element may, for example, be a zener diode.

SUMMARY OF THE INVENTION

One object of the present invention is to provide a housing for an electronic component, which provides ESD protection for an electronic element in the component.

A further object of the invention is to provide an electronic device, as well as a method for production of a housing for an electronic component.

These and other objects are attained in accordance with one aspect of the present invention directed to a housing for an electronic component, having at least two connecting parts which are partially in contact with the housing, with means being provided in order to set the conductivity of at least subareas of the housing in a defined manner and to form current paths between the connecting parts.

Another aspect of the present invention is directed to a method for production of a housing for an electronic device. The method includes providing an electrically insulating housing, and coating at least parts of the housing with an electrically conductive material, with the coating forming current paths between the connecting parts (4a, 4b) of the component.

Yet another aspect of the present invention is directed to a method for production of a housing for an electronic component. The method includes mixing an electrically conductive material with an electrically insulating material to form a housing material, and providing a housing from the housing material.

Still another aspect of the present invention is directed to an electronic device comprising at least one electronic component, at least two connecting parts in electrical contact with said electronic component, and a housing for receiving said electronic component, said at least two connecting parts being in electrical contact with the housing such as to have current paths between said connecting parts that are portions of the housing, wherein said portions of the housing that form current paths between said connecting paths have a conductivity set in a defined manner.

A housing is specified for an electronic component which has at least two connecting parts. The connecting parts are preferably at least partially located in contact with the housing. This means that a piece of each connecting part is preferably attached to or is mounted in the housing, and another piece of the connecting part preferably projects out of the housing. However, it is also possible for the entire connecting part to be attached to the housing, or for parts of the connecting part to be mounted in the housing and for other pieces of the connecting part to be attached to the housing. Pieces of the connecting parts are preferably accessible from outside the housing, so that electrical contact can be made with the connecting parts there.

Furthermore, means can be provided in order to set the conductivity of at least parts of the housing in a defined manner. This is to say that the housing has at least subareas which are conductive and have a predeterminable resistance.

These subareas of the housing result in the connecting parts being in electrical contact with one another. Current paths are preferably provided between the connecting parts through the conductive subareas of the housing. This means that current can flow from one connecting part to another connecting part, in both directions, via these subareas, with a predeterminable resistance. The means for defined setting of the conductivity of at least subareas of the housing may, for example, be provided by coating the housing with a material having a defined conductivity, or by introducing electrically conductive particles into at least parts of the housing.

The housing for an electronic component can have at least two connecting parts, which are partially in contact with the housing, and with means being provided in order to set the conductivity of at least subareas of the housing in a defined manner, and to form current paths between the connecting parts.

In one embodiment of the housing, the housing has a base body. The base body can have a recess. At least pieces of the connecting parts are particularly preferably located in the recess. The connecting parts are preferably in contact with the housing there. The recess offers, for example, space for at least one electronic component which can be mounted in the recess. There, the component is, for example, electrically conductively connected to the pieces of the connecting parts which are located in the recess.

In a further embodiment of the housing for an electronic component, the base body is at least partially coated with a conductive material. The coating preferably forms an electrically conductive connection between the connecting parts, and has a defined resistance. This means that a resistance which is connected between the connecting parts can be predetermined by adjustable variables such as the thickness, area and material of the coating.

By way of example, the entire base body of the housing together with the inner surfaces of the recess can advantageously be coated with the electrically conductive material. This allows the housing to be produced particularly easily, since this means that no structuring processes are required during the production of the coating.

In another embodiment of the housing, the inner surface of the recess can be coated with an electrically conductive material, particularly preferably with only the base of the recess being coated with the material.

Pieces of the connecting parts can be fitted on the base of the recess, so that the coating on the base of the recess forms current paths between the connecting parts. This embodiment offers the advantage that only a relatively small area needs to be coated with the conductive material. This allows the production costs for the housing to be reduced.

The coating of the base body can contain one of the following materials: carbon, graphite, TCO (Transparent Conductive Oxide) such as indium/tin oxide (ITO) or tin oxide (ZnO), metals or a semiconductor material. When using semiconductor materials, the conductivity can advantageously be set, for example, by doping with a predeterminable concentration. The resistance of the coating can thus be set particularly easily by doping. The higher the doping concentration in this case, the higher is the conductivity of the layer.

In a further embodiment of the housing, an electrically conductive material is introduced at least into parts of the housing. In this case, parts of the housing may additionally be coated with a conductive material, or else may be uncoated.

The conductive material which is introduced into parts of the housing increases the conductivity of these housing parts. These housing parts then form current paths between the connecting parts.

In one embodiment of the housing, the electrically conductive material is in the form of particles. This allows the housing to be produced particularly easily. By way of example, the particles may be mixed into the housing material, as a powder. The housing or parts of the housing is or are formed from the material that has been mixed in this way. The desired conductivity of the housing or of the housing parts can be set by the nature, size, shape and concentration of the conductive particles. In this case, the particles preferably have one of the following forms: platelets, spheres, cuboids or fibers. However, it is also possible to use particles with different geometrical shapes, or particles with an irregular shape.

In one embodiment of the housing, the electrically conductive material is introduced at least into parts of the base body of the housing. The material is advantageously introduced into the entire base body. This allows the base body to be produced particularly easily, since the base body can in this way be formed integrally from a housing material with a defined conductivity.

In another embodiment of the housing, the electrically conductive material is introduced into an encapsulation material, and together with the encapsulation material forms an encapsulation compound. This encapsulation compound is preferably introduced into the recess in the base body. The encapsulation compound advantageously at least partially covers an electronic component which is mounted in the recess. The encapsulation compound is particularly preferably in electrical contact with the connecting parts, with the encapsulation compound then forming current paths between the connecting parts. The encapsulation compound can advantageously have further components added to it.

If the electronic component is, for example, an optoelectronic component which emits light, then the encapsulation compound may, for example, contain a luminescent conversion material, which contains at least one luminescent substance. The luminescent conversion material is preferably suitable for at least partial conversion of the wavelengths of the electromagnetic radiation which is emitted from the component. The encapsulation compound can also, for example, contain diffusers, which are suitable for scattering the electromagnetic radiation.

In the situation where the encapsulation compound encases an optoelectronic component, the size and concentration of the electrically conductive particles which are contained in the encapsulation compound can advantageously be chosen such that electromagnetic radiation can pass through the encapsulation compound from the particles largely without any impediment. In this context, largely without any impediment means that at most a small proportion of the electromagnetic radiation is absorbed or reflected by the particles in the encapsulation compound, so that the emission characteristic of the component is not noticeably changed in comparison to a component with an encapsulation compound without conductive particles. The electrically conductive material preferably contains one of the following materials: carbon, graphite, TCO, ITO, ZnO, metals or a semiconductor material. The semiconductor material can be doped appropriately in order to set the conductivity in a defined manner.

Furthermore, an electronic device having one of the housings just described is specified, which has at least one electronic component with which electrical contact is made via the connecting parts.

In this case, it has been found to be particularly advantageous for current paths between the connecting parts to be formed by the housing. This means that current paths are formed through the electrically conductive parts of the housing, such as the housing base body, parts of the base body, the encapsulation compound, parts of the encapsulation compound or the base body and the encapsulation compound. This results in a defined resistance between the connecting parts, which is formed by the conductive housing parts. In this way, the housing or parts of the housing forms or form a resistance which has a defined magnitude and is connected in parallel with the component. A parallel-connected resistance such as this acts as ESD protection for the component.

In this case, the resistance is advantageously so small that it forms adequate ESD protection for the component, that is to say an adequately large proportion of the current when ESD voltage pulses occur is dissipated via the resistance rather than via the component. On the other hand, the resistance must be chosen to be sufficiently high that its power loss is considerably less than the operating power of the component. Depending on the component and the scope of desired ESD protection, the housing offers the capability to set the desired resistance.

In one embodiment of the electronic device, the electronic component is an optoelectronic component. The component can be one of the following components: a light-emitting diode, a photodiode, a laser diode. The defined resistance of the housing or of the housing parts in this case advantageously offers ESD protection for the component in the reverse-biased direction of the diode.

Furthermore, a method is specified for production of a housing for an electronic component. In this case, an electrically insulating housing is produced first of all. At least parts of the housing are then coated with an electrically conductive material. The material forms a resistance of defined magnitude between at least two connecting parts, which can be fitted to or in the housing before or after the coating process.

One of the following coating methods can be used for coating the housing: printing, vapor-deposition, sputtering on, doctor blading conductive material on. Depending on the material which is used, other coating methods are, however, also feasible.

In addition, a method is specified for production of a housing, in which an electrically conductive material is mixed with an electrically insulating material to form a housing material. The housing is then formed from the housing material. The electrically conductive material is in this case preferably in powder form. This powder can be added to the insulating material in a controlled manner. A housing with defined conductivity can be produced by variables which can be chosen as required, such as the composition and amount of the powder, as well as the size and shape of the powder particles.

DETAILED DESCRIPTION OF THE DRAWINGS

Identical parts and parts having the same effect are in each case provided with the same reference symbols in the exemplary embodiments and in the figures. The illustrated parts and the size ratios of the parts with respect to one another should not be regarded as being to scale. In fact, some of the details in the figures are illustrated in an enlarged form, in order to assist understanding.

Figure 1:
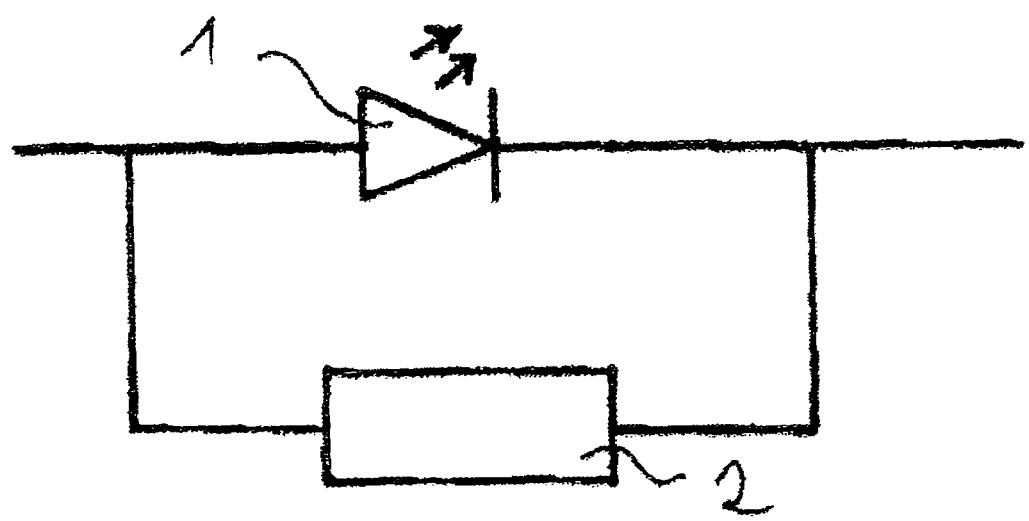
FIG. 1 shows, by way of example, an equivalent circuit for a housing as described here with one component.

FIG. 1 shows an equivalent circuit of a component described here with a housing which has a defined resistance 2, and a component which in this exemplary embodiment is formed by a light-emitting diode 1. The resistance 2 is connected in parallel with the anode and cathode of the light-emitting diode 1. ESD voltage pulses are at least partially dissipated through the resistance 2. The resistance 2 then represents ESD protection for the diode 1.

To provide protection against electrostatic discharge during handling of the device (e.g., before use of the device), an ESD protective package has been used in the prior art. Often such a package includes an electrically conductive foil in which the device is packed, as is commonly done with computer memory chips and graphics cards.

If the resistance 2 is in this case between 1 k$\Omega$ and 1 M$\Omega$, then the ESD protection which is provided by the resistance is sufficient to the extent that there is no need for an ESD protective package for the device. Because of the magnitude of the resistance, the power loss during operation of the component is very low.

One advantageous feature for this resistance range is that the costs for ESD protective packaging for the device are saved. However, in this case additional ESD protection, for example in the form of a further light-emitting diode connected in anti-parallel must be provided for most commercially available light-emitting diodes.

For a resistance 2 in the range from 500$\Omega$ to 1 k$\Omega$, the resistance 2 offers ESD protection up to 15 kV based on the human body model. This means that, in the event of a discharge of a 100 pF capacitance through a 1500$\Omega$ resistance, the resistance 2 offers ESD protection up to voltages of 15 kV.

This protection is adequate for many components, so that there is no need for any additional ESD protection. Another advantageous feature in this case is that the protective packaging, which is often complex, is not required. The elimination of ESD protection in the form of an LED as described above, has several advantages. Such an additional LED is wire connected with connecting parts of the device and the main component. This causes shadowing or interruption of the reflector caused by the LED and/or wires. Thus, by avoiding the need for such an additional LED, the shadowing or interruption of reflectors are prevented, thereby increasing the efficiency of these devices. Also, the housing can be designed to be smaller.

Resistance 2 in the range from 140$\Omega$ to 160$\Omega$ means that the housing provides complete ESD protection, provided that the breakdown voltage of the component is at least about 200 V without the parallel-connected resistance 2. For power components with power losses in the watt range, the power loss in the resistance is in this case also negligibly small during normal operation. The power loss in the resistance is thus only a few milliwatts at the normal operating voltages for high-power light-emitting diodes (approximately 3 V).

Figure 2:
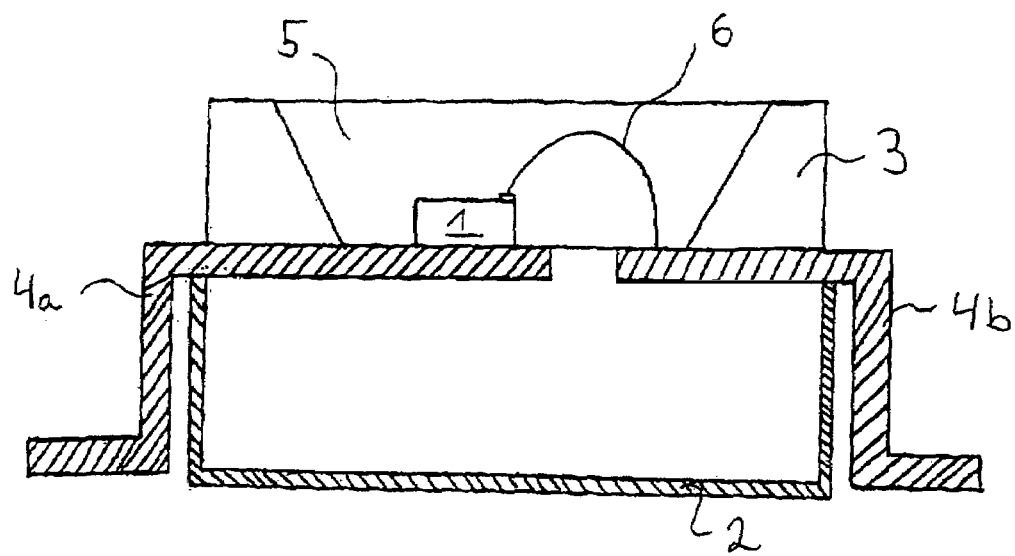
FIG. 2 shows, by way of example, an outline sketch of a first exemplary embodiment of a device described here.

FIG. 2 shows a housing in which the resistance 2 is provided by a coating with a conductive material which is located on the lower face of the base body 3 of the housing. The base body preferably contains a plastic such a polyether ether ketone (PEEK), polyphthalamide (PPA) or liquid-crystal copolyester (LCP). The base body may, however, also contain a ceramic such as aluminum oxide, aluminum nitride or beryllium oxide (BeO). The housing base body particularly preferably contains an electrically insulating material.

The resistance 2 connects the two connecting parts 4a, 4b and is connected in parallel with the component 1 which, for example, is bonded to the connecting part 4a and makes contact with the connecting part 4b by means of wire bonding 6. The component 1 can also be surrounded by an encapsulation compound 5. In the case of an optoelectronic component, the encapsulation compound 5 is preferably transparent for the electromagnetic radiation to be emitted or to be received by the component. The encapsulation compound preferably contains an epoxy resin or silicone. By way of example, it may additionally contain a luminescent conversion material, which contains suitable luminescent substances for wavelength conversion of the radiation. Suitable organic and inorganic fluorescent substances are described, for example, in U.S. Pat. No. 6,066,861 A1, which is hereby incorporated by reference with regard to the fluorescent substances. The component 1 can be, for example, one of the following opto-electronic components: light-emitting diode chip, a photo-diode chip, or a laser diode chip.

Figure 3:
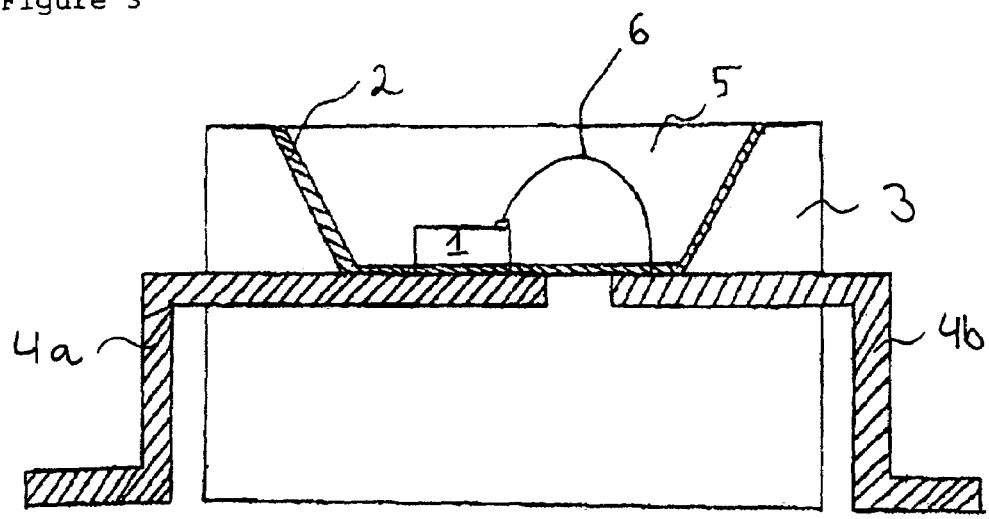
FIG. 3 shows, by way of example, an outline sketch of a second exemplary embodiment of a device described here.

FIG. 3 shows a further exemplary embodiment of the housing, in which the inner surfaces of the recess are coated with a conductive material. The coating also in this case connects the two connecting parts 4a and 4b conductively to one another, and acts as a resistance connected in parallel with the component 1. In this example, this advantageously means that the coating 2 is protected by the encapsulation compound 5 against contamination or mechanical influences. A resistance 2 which is formed by the coating can thus be kept constant for a long time period. If the coating 2 is, for example, a metallic coating, then the coating 2 can at the same time be used as a reflector for the electromagnetic radiation which is produced during operation of an optoelectronic component 1.

Figure 4:
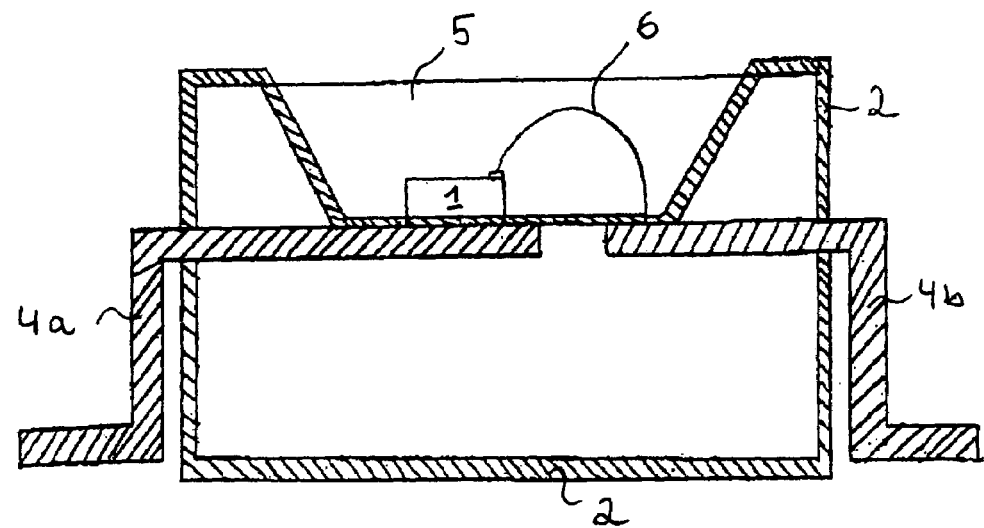
FIG. 4 shows, by way of example, an outline sketch of a third exemplary embodiment of a device described here.

FIG. 4 shows an exemplary embodiment of the housing, in which all of the outer surfaces of the housing together with the inner surfaces of the recess are coated with the conductive material. In this exemplary embodiment, the coating can be applied in a particularly simple manner, since there is no need to structure the coating by applying the coating in a predetermined manner to selected parts of the housing. Furthermore, it is possible for the encapsulation compound 5 to also be coated with electrically conductive material.

Figure 5:
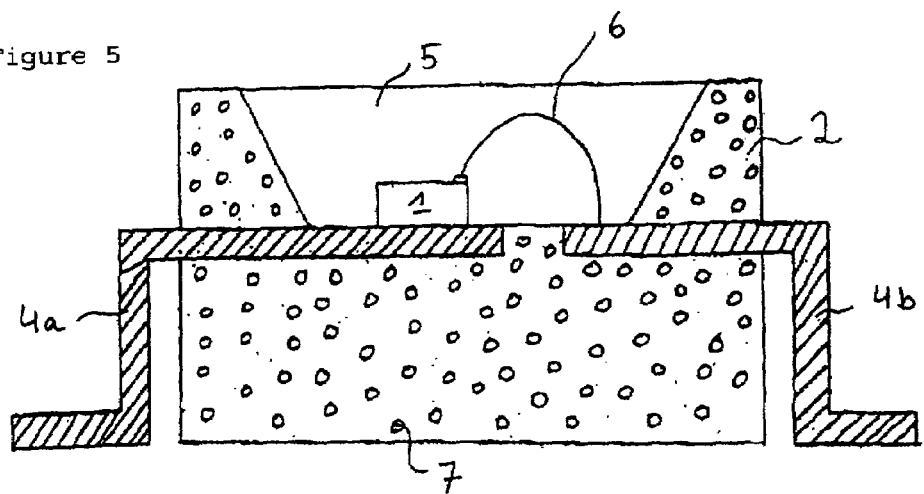
FIG. 5 shows, by way of example, an outline sketch of a fourth exemplary embodiment of a device described here.

FIG. 5 shows an exemplary embodiment of the housing, in which electrically conductive particles 7 have been introduced into the base body 3 of the housing. In this way, the entire base body 3 forms a resistance 2 connected in parallel with the connecting parts 4a and 4b. The resistance 2 can be set by means of the concentration, size and material of the particles 7. However, in this case, it is also possible to choose the concentration of the electrically conductive particles 7 in a defined manner within predeterminable areas of the base body 3. These parts of the base body 3 then preferably form current paths between the connecting parts.

Figure 6:
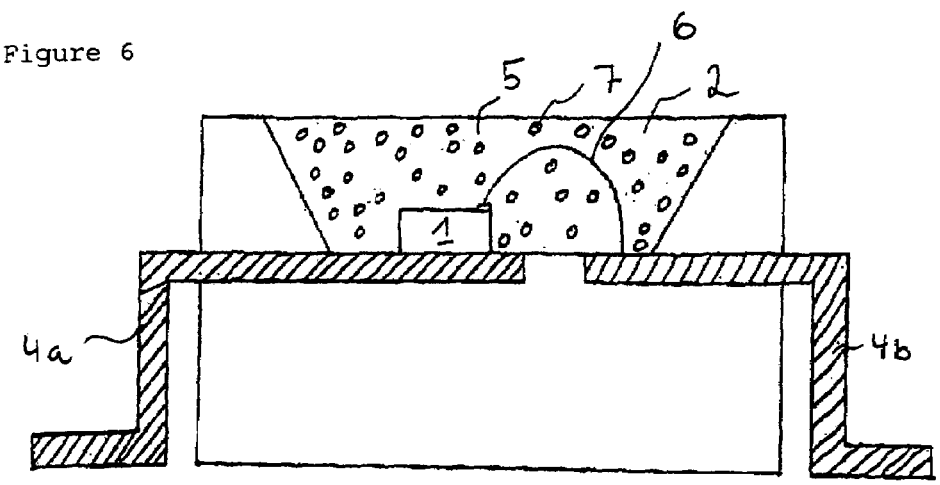
FIG. 6 shows, by way of example, an outline sketch of a fifth exemplary embodiment of a device described here.

FIG. 6 shows an exemplary embodiment in which the particles 7 are located in the encapsulation compound 5. The resistance 2 is thus formed by the encapsulation compound 5.

Figure 7:
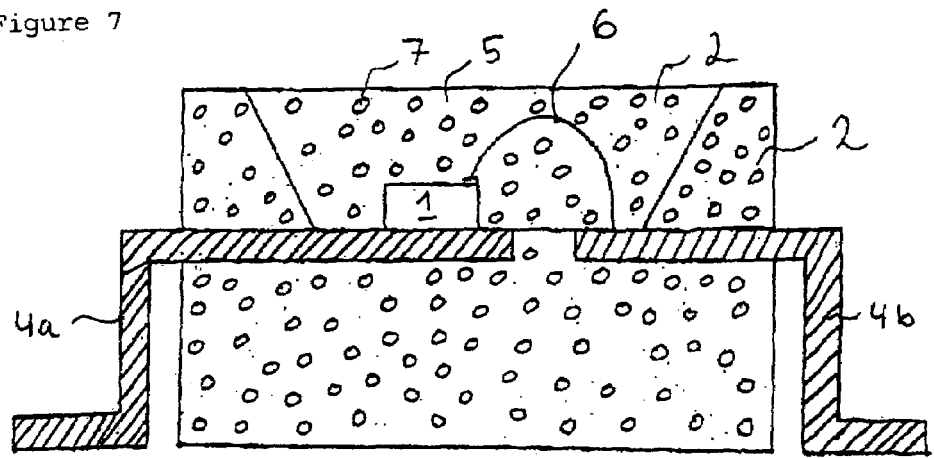
FIG. 7 shows, by way of example, an outline sketch of a sixth exemplary embodiment of a device described here.

In the exemplary embodiment shown in FIG. 7, conductive particles 7 are arranged not only in the base body 3 but also in the encapsulation compound 5. The entire housing in this case forms the resistance 2.

The invention is not restricted by the description on the basis of the exemplary embodiments. In fact, the invention covers any new feature and any combination of features, in particular including any combination of features in the patent claims, even if this feature or this combination is not itself explicitly stated in the patent claims or in the exemplary embodiments.

We claim:

1. A housing for an electronic component, having at least two connecting parts, which are partially in contact with the housing, with means being provided in order to set the conductivity of at least subareas of the housing in a defined manner and to form current paths between the connecting parts,
   wherein the housing comprises a base body and electrically-conductive material is embedded at least into parts of said base body, and
   wherein the electrically conductive material is comprised of particles and the current paths between the connecting parts are formed by the particles.

2. The housing for an electronic component as claimed in claim 1, wherein the base body includes a recess.

3. The housing for an electronic component as claimed in claim 2, wherein the base body is at least partially coated with an electrically conductive material.

4. The housing for an electronic component as claimed in claim 3, in which the coating contains at least one of the following materials: carbon, graphite, TCO, ZnO, ITO, metal, semiconductor material.

5. The housing for an electronic component as claimed in claim 2, in which the inner surfaces of the recess are at least partially coated with an electrically conductive material.

6. The housing for an electronic component as claimed in claim 2, in which the base of the recess is at least partially coated with an electrically conductive material.

7. The housing for an electronic component as claimed in claim 1, wherein the particles comprise platelets, spheres, cuboids and fibers.

8. The housing for an electronic component as claimed in claim 1, wherein the electrically conductive material contains at least one of carbon, graphite, TCO, ITO, ZnO, metal and semiconductor material.

9. The housing for an electronic component as claimed in claim 1, wherein an encapsulation compound is introduced into the recess in the base body, and the encapsulation compound contains an electrically conductive material.

10. An electronic device having the housing as claimed in claim 1, said device having at least one electronic component with which electrical contact is made through the connecting parts.

11. The electronic device as claimed in claim 10, wherein the housing forms a resistance which is connected in parallel with the component, and provides electrostatic discharge protection for the component.

12. The electronic device as claimed in claim 10, wherein the electronic component is one of the following optoelectronic components a light-emitting diode, a photodiode, and a laser diode.

13. An electronic device comprising:
   at least one electronic component;
   at least two connecting parts in electrical contact with said electronic component; and
   a housing for receiving said electronic component, said at least two connecting parts being in electrical contact with the housing such that the current paths between said connecting parts are formed by portions of the housing, wherein said portions of the housing that form current paths between said connecting parts have a conductivity set in a defined manner;
   wherein the housing comprises a base body and electrically conductive material is embedded at least into parts of said base body; and
   wherein the electrically conductive material is comprised of particles and the current paths between the connecting parts are formed by the particles.

14. The housing for an electronic component as claimed in claim 13, wherein the body includes a recess.

15. The housing for an electronic component as claimed in claim 14, wherein the base body is at least partially coated with an electrically conductive material.

16. The housing for an electronic component as claimed in claim 15, in which the coating contains at least one of the following materials: carbon, graphite, TCO, ZnO, ITO, metal, semiconductor material.

17. The housing for an electronic component as claimed in claim 14, in which the inner surfaces of the recess are at least partially coated with an electrically conductive material.

18. The housing for an electronic component as claimed in claim 14, in which the base of the recess is at least partially coated with an electrically conductive material.

19. The housing for an electronic component as claimed in claim 13, wherein the particles comprise one of platelets, spheres, cuboids and fibers.

20. The housing for an electronic component as claimed in claim 13, wherein the electrically conductive material contains at least one of carbon, graphite, TCO, ITO, ZnO, metal and semiconductor material.

21. The housing for an electronic component as claimed in claim 13, wherein an encapsulation compound is introduced into the recess in the base body, and the encapsulation compound contains an electrically conductive material.

* * * * *